(12) United States Patent
Petz et al.

(10) Patent No.: US 9,444,042 B2
(45) Date of Patent: Sep. 13, 2016

(54) MEMORY CELLS AND METHODS OF FORMING MEMORY CELLS

(71) Applicant: Micron Technology, Inc., Boise, ID (US)

(72) Inventors: Christopher W. Petz, Boise, ID (US); Dale W. Collins, Boise, ID (US); Scott E. Sills, Boise, ID (US); Shuichiro Yasuda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/956,291

(22) Filed: Dec. 1, 2015

(65) Prior Publication Data

US 2016/0093803 A1    Mar. 31, 2016

Related U.S. Application Data

(63) Continuation of application No. 14/070,423, filed on Nov. 1, 2013, now Pat. No. 9,209,388.

(51) Int. Cl.
*H01L 45/00* (2006.01)

(52) U.S. Cl.
CPC ......... *H01L 45/1246* (2013.01); *H01L 45/085* (2013.01); *H01L 45/12* (2013.01); *H01L 45/1233* (2013.01); *H01L 45/1266* (2013.01); *H01L 45/141* (2013.01); *H01L 45/142* (2013.01); *H01L 45/143* (2013.01); *H01L 45/144* (2013.01); *H01L 45/145* (2013.01); *H01L 45/146* (2013.01); *H01L 45/1608* (2013.01)

(58) Field of Classification Search
CPC . H04L 45/1233; H04L 45/06; H04L 45/144; H04L 45/148; H04L 21/0252; G11C 11/5678; G11C 13/0004
USPC ..................... 365/148, 163; 257/2, E31.008; 438/102, 95
See application file for complete search history.

(56) References Cited

U.S. PATENT DOCUMENTS

| | | | |
|---|---|---|---|
| 2007/0008773 A1* | 1/2007 | Scheuerlein | H01L 45/1675 365/161 |
| 2007/0187829 A1 | 8/2007 | Lam et al. | |
| 2009/0180314 A1* | 7/2009 | Liu | G11C 11/5678 365/163 |
| 2009/0231910 A1* | 9/2009 | Liu | H01L 27/2427 365/163 |

OTHER PUBLICATIONS

Anbarasu et al., "The Presence of a Thermally Reversing Window in Al—Te—Si Glasses Revealed by Alternating Differential Scanning Calorimetry and Electrical Switching Studies", Journal of Non-Crystalline Solids vol. 354, 2008, Netherlands, pp. 3369-3374.

* cited by examiner

*Primary Examiner* — David Vu
*Assistant Examiner* — Jonathan Han
(74) *Attorney, Agent, or Firm* — Wells St. John P.S.

(57) ABSTRACT

Some embodiments include a memory cell that has an electrode, a switching material over the electrode, a buffer region over the switching material, and an ion reservoir material over the buffer region. The buffer region includes one or more elements from Group 14 of the periodic table in combination with one or more chalcogen elements. Some embodiments include methods of forming memory cells.

21 Claims, 6 Drawing Sheets

MEMORY CELLS AND METHODS OF FORMING MEMORY CELLS

RELATED PATENT DATA

This patent resulted from a continuation of U.S. patent application Ser. No. 14/070,423 which was filed Nov. 1, 2013, and which is hereby incorporated by reference.

TECHNICAL FIELD

Memory cells and methods of forming memory cells.

BACKGROUND

Integrated memory may be used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory cell is a programmable metallization cell (PMC). Such may be alternatively referred to as conductive bridging random access memory (CBRAM), nanobridge memory, or electrolyte memory. A PMC may use ion conductive switching material (for instance, a suitable chalcogenide or any of various suitable oxides) and an ion reservoir material proximate the switching material. The ion reservoir material and switching material may be provided between a pair of electrodes. A suitable voltage applied across the electrodes can cause ions to migrate from the ion reservoir material into the switching material to thereby create one or more current-conductive paths through the switching material. An opposite voltage applied across the electrodes essentially reverses the process and thus removes the current-conductive paths. A PMC thus comprises a high resistance state (corresponding to the state lacking a conductive bridge extending through a switching material) and a low resistance state (corresponding to the state having the conductive bridge extending through the switching material), with such states being reversibly interchangeable with one another.

Although there has been effort toward development of PMCs and other memory cells, there remains a need for improved memory cells.

DETAILED DESCRIPTION OF THE ILLUSTRATED EMBODIMENTS

A PMC may have a substantial energy barrier to ion migration between an ion reservoir material and a switching material. Such energy barrier may impede ion migration between the ion reservoir material and the switching material. Accordingly, a buffer region may be provided between the ion reservoir material and the switching material to create an intermediate step along the energy barrier between the ion reservoir material and the switching material to thereby facilitate ion movement between the ion reservoir material and the switching material. Problems are encountered during fabrication and utilization of such buffer regions in that the materials utilized for the buffer regions may be reactive with ambient and/or may delaminate from adjacent materials. Such problems may lead to impaired performance of memory cells, and ultimately to device failure. Some embodiments include improved buffer region materials which alleviate or prevent the problems described above. Example embodiments are described with reference to FIGS. 1-7.

Figure 1:
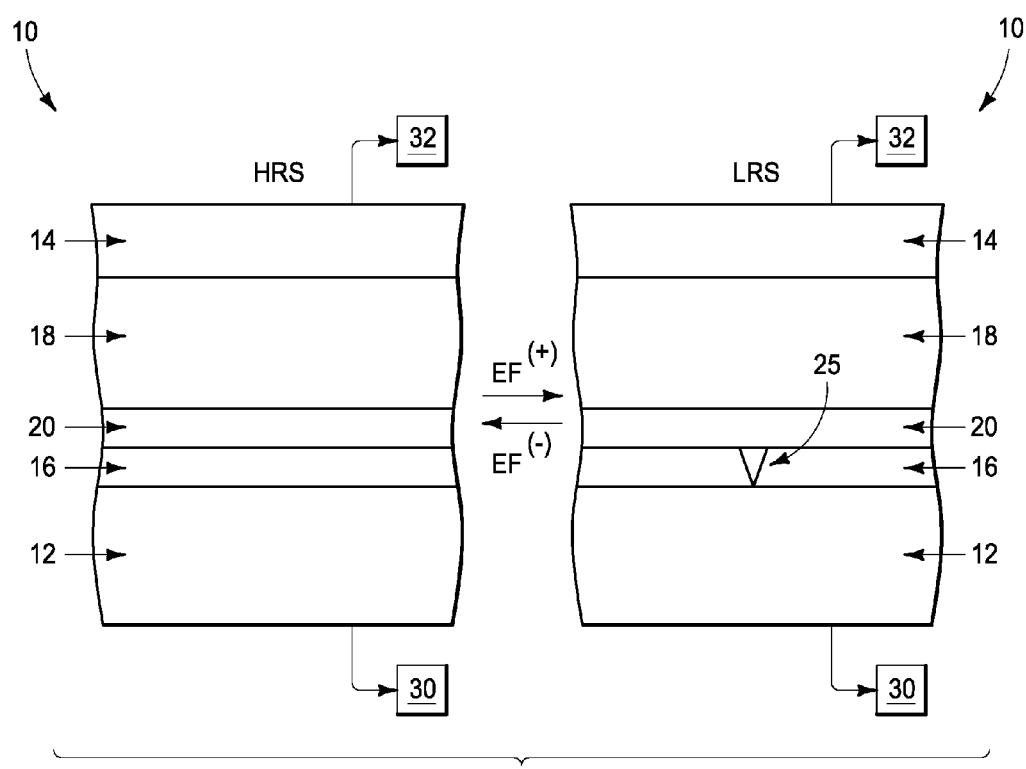
FIG. 1 shows an example embodiment PMC in cross-sectional side view reversibly transitioning between a low resistance state and a high resistance state.

Referring to FIG. 1, a PMC (i.e., memory cell) 10 is illustrated in two modes corresponding to a high resistance state (HRS) and a low resistance state (LRS). The two modes are reversibly interchanged with one another through application of electric fields $EF^+$ and $EF^-$, with $EF^+$ being of opposite polarity relative to $EF^-$.

The PMC comprises a pair of electrodes 12 and 14; and comprises a switching material 16 and an ion reservoir material 18 between the electrodes. The PMC also comprises a buffer region 20 between the switching material 16 and the ion reservoir material 18.

Electrodes 12 and 14 may be referred to as a first electrode and a second electrode, respectively. The electrodes may comprise any suitable conductive composition or combination of compositions; and may be the same composition as one another or may be different compositions relative to one another. In some embodiments, the electrodes may comprise, consist essentially of, or consist of one or more of various metals (for example, tungsten, titanium, etc.) or metal-containing compositions (for instance, metal nitride, metal carbide, metal silicide, etc.). For instance, in some embodiments the electrode 12 may comprise, consist essentially of, or consist of titanium nitride; and the electrode 14 may comprise, consist essentially of, or consist of tungsten.

The memory cell 10 is shown to have the bottom electrode 12 connected to external circuitry 30, and to have the top electrode 14 connected to external circuitry 32. Circuitries 30 and 32 may correspond to sense and/or access lines coupled to the electrodes, and configured for providing the appropriate electric fields across the memory cell during read/write operations. In some embodiments, the illustrated memory cell may be one of a plurality of memory cells of a memory array, and the circuitries 30 and 32 may be utilized to uniquely address each of the memory cells. In some embodiments, a "select device" (not shown) may be provided adjacent the memory cell to reduce undesired current leakage to and/or from the memory cell during utilization of the memory cell in a memory array. Example select devices include diodes, transistors, ovonic threshold switches, etc.

The memory cell 10 may be supported by a semiconductor substrate (not shown). Such substrate may comprise, for example, monocrystalline silicon and/or other suitable semiconductor materials, and may be part of a semiconductor die. Accordingly the memory cell 10 may be part of an integrated circuit supported by a semiconductor chip.

The switching region 16 may be a solid, gel, or any other suitable phase, and may comprise chalcogenide-type materials (for instance, materials comprising germanium in combination with one or more of antimony, tellurium, sulfur and selenium), oxides (for instance, aluminum oxide, zirconium oxide, hafnium oxide, tungsten oxide, silicon oxide, etc.) and/or any other suitable materials.

The ion reservoir material 18 contributes ions which ultimately form one or more conductive bridges 25 across the switching material 16. The ion reservoir material may comprise any suitable composition or combination of compositions. In some embodiments, the ion reservoir material may comprise one or more of aluminum, copper, silver and chalcogen (for instance, tellurium); and may be configured for contributing aluminum cations, copper cations and/or silver cations for formation of one or more conductive bridges. The conductive bridges may have any suitable configuration and may be filaments of conductive ions or clusters in some embodiments.

In the shown embodiment, the conductive bridge 25 is diagrammatically illustrated as being entirely absent in the high resistance state (HRS) configuration of the memory cell. In other embodiments, a portion of the conductive bridge may remain in the HRS configuration of the memory cell.

Although the ion reservoir material is shown comprising a single composition, in other embodiments the ion reservoir material may comprise two or more different compositions. Similarly, although the switching material is shown comprising only a single composition, in other embodiments the switching material may comprise two or more different compositions.

The buffer region 20 may comprise one or more elements from Group 14 of the periodic table in combination with one or more chalcogen elements (with chalcogen elements being the elements below oxygen in Group 16 of the periodic table). The buffer region 20 may have a thickness within a range of from about 20 Å to about 100 Å in some embodiments; and in some embodiments may have a thickness of about 50 Å.

The elements from Group 14 of the periodic table may be present in the buffer region to a total concentration within a range of from about 5 atomic percent to about 25 atomic percent; and in some embodiments may be present to a total concentration within a range of from about 10 atomic percent to about 15 atomic percent. In some embodiments, the elements from Group 14 of the periodic table may comprise, consist essentially of, or consist of one or more of carbon, silicon, germanium and tin.

In some embodiments, the chalcogen elements within the buffer region may be comprised by a metal-chalcogenide matrix, and such metal-chalcogenide matrix may be present to a total concentration of greater than about 50 atomic percent. In some embodiments, the chalcogen elements within the buffer region may comprise, consist essentially of, or consist of one or more of tellurium, sulfur and selenium. For instance, in some embodiments the chalcogen within the buffer region may correspond to tellurium, and may be present as one or more metal tellurides selected from the group consisting of aluminum telluride, hafnium telluride and zirconium telluride. Accordingly, in some embodiments a metal-chalcogenide matrix of the buffer region may comprise, consist essentially of, or consist of one or more of aluminum telluride, hafnium telluride and zirconium telluride.

The buffer region 20 may be formed with any suitable processing. For instance, in some embodiments the buffer region may be deposited utilizing physical vapor deposition with a composite target containing metal, chalcogen and one or more Group 14 elements. Alternatively, the buffer region may be deposited utilizing physical vapor deposition with a composite target comprising metal and chalcogen, together with vapor deposition of desired Group 14 elements.

The elements from Group 14 of the periodic table may stabilize the chalcogen-containing matrix within the buffer region. For instance, the chalcogen-containing matrix may comprise a metal in combination with chalcogen, and such combination will have a stable stoichiometry. For instance, aluminum telluride may be considered to comprise the metal corresponding to aluminum in combination with the chalcogen corresponding to tellurium; and such combination has a stable stoichiometry corresponding to $Al_2Te_3$. If the relative concentration of tellurium to aluminum is outside of such stable stoichiometry, precipitates, crystallites, and/or other undesired defects may form within the buffer region. However, the elements from Group 14 of the periodic table may stabilize materials within the chalcogen-containing matrix to alleviate or prevent formation of such defects. For instance, if a metal-chalcogen matrix is chalcogen-heavy, metal-light relative to the stable stoichiometry, the elements from Group 14 may stabilize the excess chalcogen. As an example, if an aluminum telluride matrix has an excess of tellurium, one or more of carbon, silicon and germanium may be provided within such matrix to stabilize the excess tellurium and thereby avoid having the tellurium separate from the matrix into precipitates, crystallites and/or other defects.

Stabilization of a chalcogen-containing matrix within a buffer region through utilization of Group 14 elements may improve chemical stability of the buffer region, may improve integrity of adhesion of the buffer region to materials directly adjacent the buffer region, and/or may improve cyclic endurance of a memory cell utilizing the buffer region; as compared to conventional memory cells lacking such stabilization.

The buffer region 20 of FIG. 1 is shown to comprise a homogeneous composition. In other embodiments, the buffer region may have other configurations.

Figure 2:
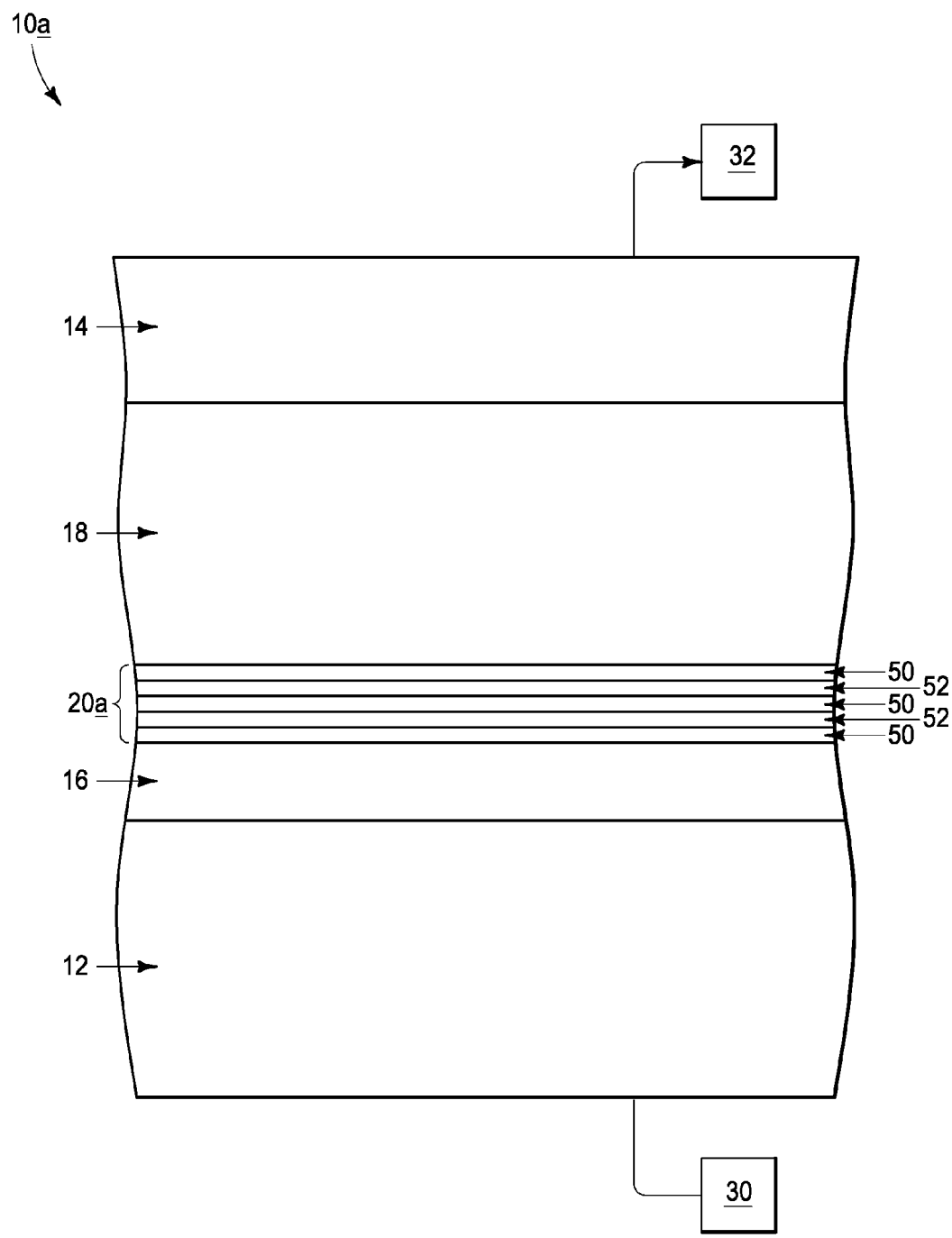
FIG. 2 shows an example embodiment memory cell in cross-sectional side view.

FIG. 2 shows a memory cell 10a having a buffer region 20a comprising a laminate of alternating layers 50 and 52. Any suitable number of alternating layers may be utilized in the buffer region. The memory cell 10a is shown in a high resistance state (HRS), and accordingly the conductive bridge 25 (FIG. 1) is not present.

One of the layers 50 and 52 may comprise Group 14 elements dispersed throughout a metal chalcogenide-containing matrix (for instance, a matrix comprising one or more of aluminum telluride, zirconium telluride and hafnium telluride), and the other of the layers 50 and 52 may comprise the metal chalcogenide-containing matrix without the Group 14 elements. Alternatively, one of the layers 50 and 52 may comprise one or more Group 14 elements dispersed throughout a film without chalcogen, and the other of the layers may comprise a metal chalcogenide-containing matrix. Regardless, a concentration of the Group 14 elements throughout the entirety of buffer region 20a may be within the desired range discussed above regarding FIG. 1, and the concentration of metal chalcogenide throughout the buffer region may be within the desired range discussed above regarding FIG. 1.

In some embodiments, all of the layers 50 and 52 comprise common thicknesses as one another (as shown). In other embodiments, thicknesses of the layers may vary throughout the laminate. In some embodiments, the thicknesses of layers comprising Group 14 elements may vary so that a concentration of the Group 14 elements is higher in one part of the buffer region as compared to another part. In some embodiments, such variation may create a gradient of concentration of Group 14 elements within the buffer region. Alteration of thicknesses of Group 14-element-containing layers within a laminate is one method to achieve a gradient of Group 14 elements within a buffer region, and other methods may be utilized in other embodiments. For instance, in some embodiments some of the Group 14 element-containing layers may have higher concentrations of Group 14 element than others of the Group 14 element-containing layers.

Figure 3:
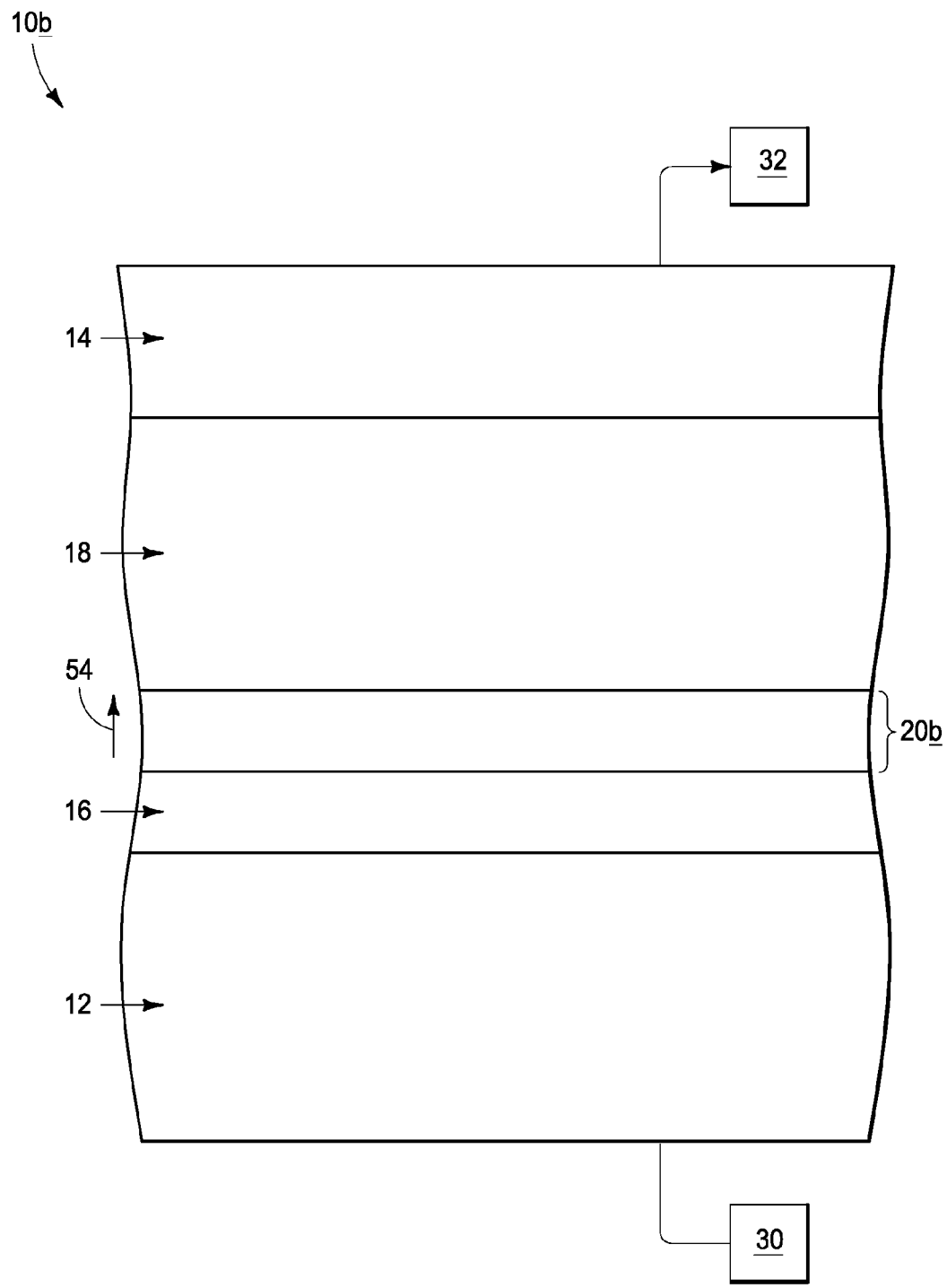
FIG. 3 shows another example embodiment memory cell in cross-sectional side view.

FIG. 3 shows a memory cell construction 10b illustrating an example embodiment in which a gradient of Group 14 element concentration extends across a buffer region 20b. The gradient is diagrammatically illustrated with an arrow 54, and in the shown embodiment increases along a direction going from the switching material 16 toward the ion reservoir material 18. Accordingly, the concentration of Group 14 element is highest along an interface with the ion reservoir material 18, and is lowest along an interface with the switching material 16. Such gradient may be formed utilizing a laminate construction of the type described above with reference to FIG. 2 (although the individual layers of such laminate are not shown in FIG. 3), or may be formed with any other suitable method; including, for example, enrichment of deposited metal chalcogenide with one or more Group 14 elements during deposition of the metal chalcogenide.

The illustrated gradient of Group 14 element concentration may enable performance characteristics of a memory cell to be tailored for a particular application. For instance, it may be desired to utilize higher concentrations of Group 14 element along an interface with an ion reservoir material to improve adhesion to the ion reservoir material, and yet suitable adhesion may be achieved relative to a switching material with lower concentrations of group 14 element. Accordingly, the gradient 54 of FIG. 3 may be desired. In other embodiments, opposite considerations may apply, and accordingly a gradient reversed relative to the gradient 54 of FIG. 3 may be utilized.

Figure 4:
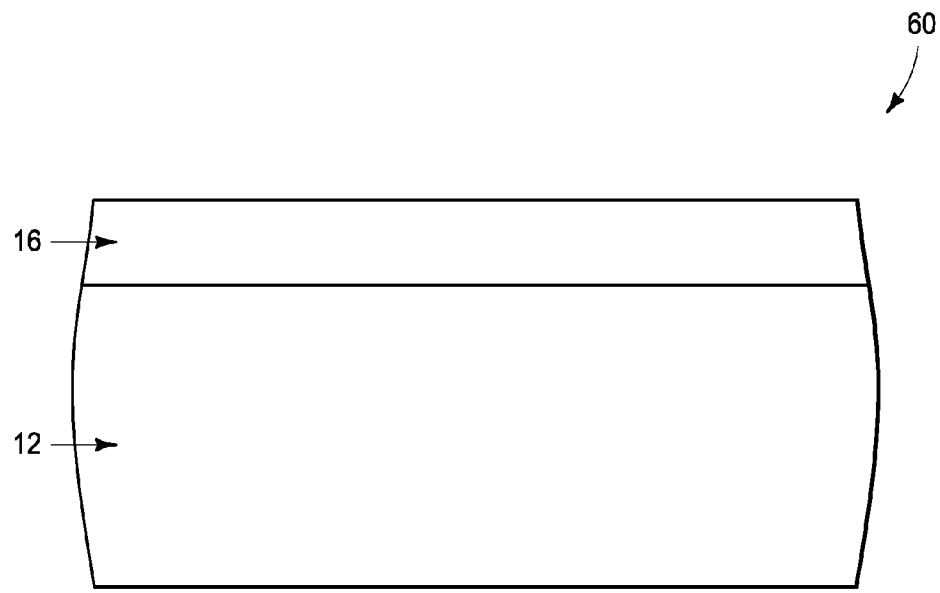
FIGS. 4-6 show a semiconductor construction in cross-sectional side view, and illustrate process stages of an example embodiment process for forming an example embodiment memory cell.
Figure 5:
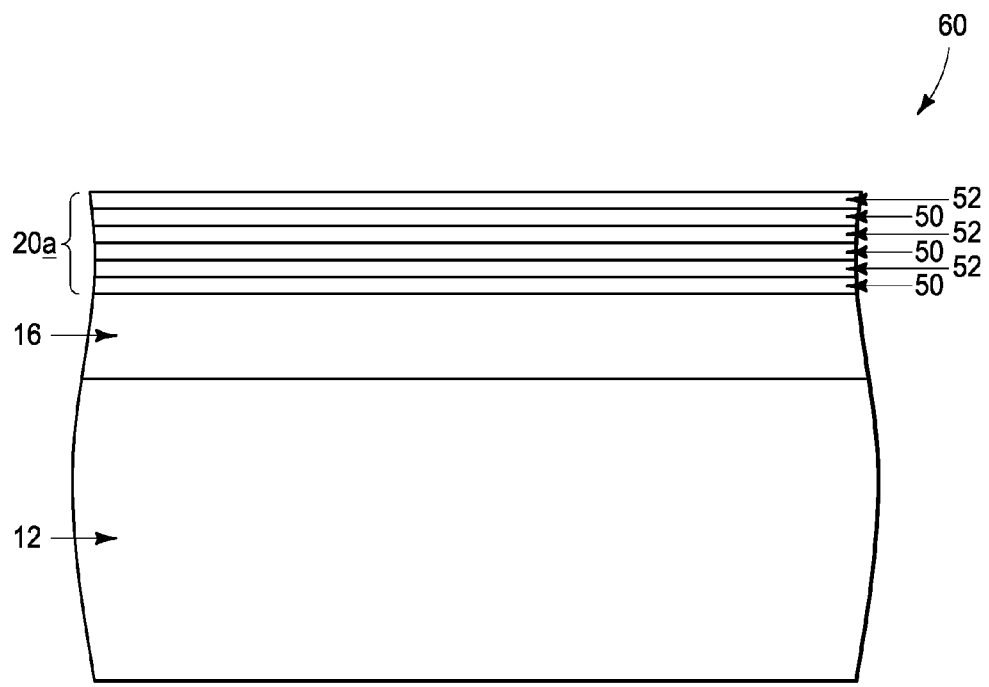
Figure 6:
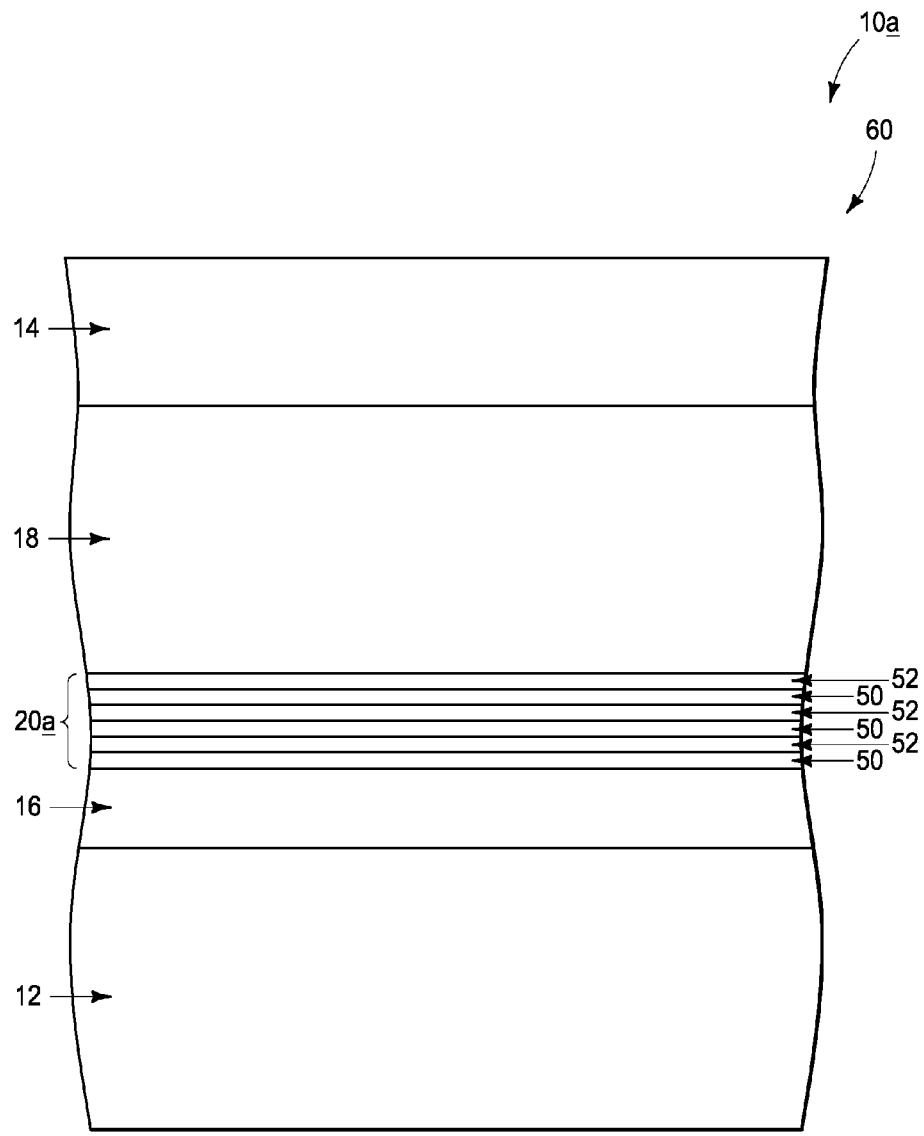

The memory cells of FIGS. 1-3 may be formed utilizing any suitable processing. FIGS. 4-6 illustrate example processing that may be utilized to form the memory cell 10a of FIG. 2.

Referring to FIG. 4, a construction 60 is shown comprising the switching material 16 formed over the electrode 12. The switching material 16 may be deposited over electrode 12 with any suitable fabrication method, including, for example, one or more of atomic layer deposition (ALD), chemical vapor deposition (CVD), and physical vapor deposition (PVD).

Referring to FIG. 5, the laminate 20a is formed over the switching material 16. Such laminate may be formed with any suitable processing, including, for example, the example processing described above with reference to FIG. 2.

Referring to FIG. 6, the ion reservoir material 18 is formed over the laminate 20a, and then the electrode 14 is formed over the ion reservoir material 18. The ion reservoir material 18 and the electrode 14 may be formed with any suitable processing, including, for example, one or more of ALD, CVD and PVD.

Figure 7:
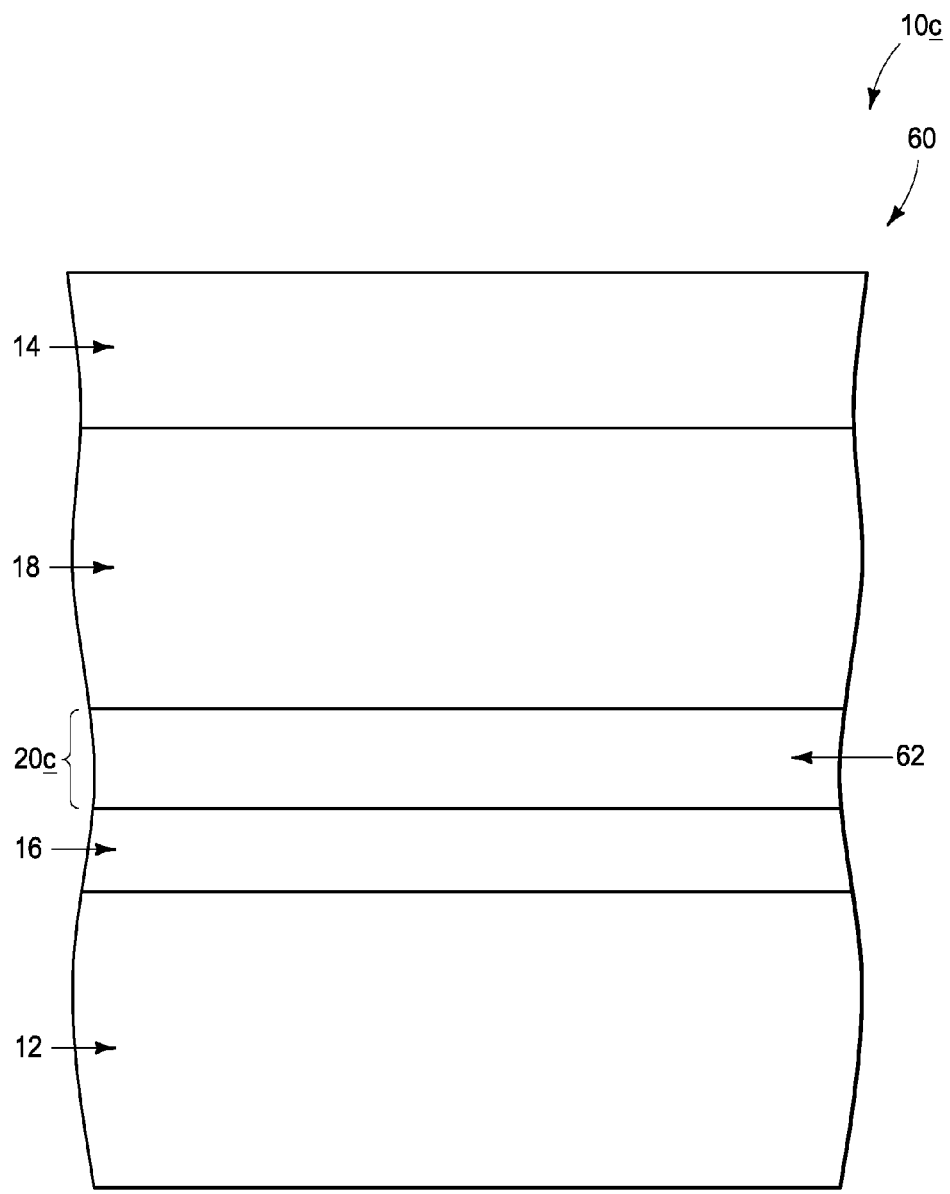
FIG. 7 shows a semiconductor construction in cross-sectional side view, and illustrates a process stage that may follow that of FIG. 7 in an example embodiment process for forming an example embodiment memory cell.

Construction 60 at the process stage of FIG. 6 comprises the memory cell 10a of FIG. 2. Such memory cell may be utilized as is in a memory array. Alternatively, the construction 60 may be treated (for instance, thermally treated) to cause materials from layers 50 and 52 to disperse and thereby convert the laminate of FIG. 6 to a more homogeneous structure 62 as shown in FIG. 7. Such structure 62 becomes a buffer region 20c of a memory cell 10c. The buffer region 20c may have a gradient of Group 14 element concentration formed therein, analogous to the gradient described above with reference to FIG. 3, or may comprise substantially uniform Group 14 element concentration dispersed throughout.

The memory cells discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a memory cell that comprises an electrode, a switching material over the electrode, a buffer region over the switching material, and an ion reservoir material over the buffer region. The buffer region comprises one or more elements from Group 14 of the periodic table in combination with one or more chalcogen elements.

In some embodiments, the invention includes a memory cell which comprises an electrode, a switching material over the electrode, a buffer region over the switching material, and an ion reservoir material over the switching material. The switching material comprises aluminum oxide, and the ion reservoir material comprises one or more tellurides in combination with one or more of aluminum, copper and silver. The buffer region comprises one or more tellurides selected from the group consisting of aluminum telluride, hafnium telluride and zirconium telluride; and comprises one or more elements from Group 14 of the periodic table to a total concentration within a range of from about 5 atomic percent to about 25 atomic percent.

In some embodiments, the invention includes a method of forming a memory cell. A switching material is formed over a first electrode. A buffer region is formed over the switching material. The buffer region comprises one or more elements from Group 14 of the periodic table in combination with one or more chalcogen elements. The forming of the buffer region comprises forming a laminate containing layers that comprise Group 14 elements alternating with layers that do not comprise Group 14 elements. An ion reservoir material is formed over the buffer region. A second electrode is formed over the ion reservoir material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
   an electrode;
   an ion-conductive switching material over the electrode;
   a buffer region over the ion-conductive switching material;
   an ion reservoir material over the buffer region; and
   the buffer region comprising a laminate containing layers that comprise Group 14 elements alternating with layers that do not comprise Group 14 elements.

2. The memory cell of claim 1 wherein the Group 14 elements present in to a total concentration within a range of from about 5 atomic percent to about 25 atomic percent.

3. The memory cell of claim 1 wherein the Group 14 elements are present in the buffer region to a total concentration within a range of from about 10 atomic percent to about 15 atomic percent.

4. The memory cell of claim 1 wherein the buffer region has a thickness within a range of from about 20 angstroms to about 100 angstroms.

5. The memory cell of claim 1 wherein the ion-conductive switching material comprises a chalcogenide-type material.

6. The memory cell of claim 5 wherein the chalcogenide-type material comprises one or more of tellurium, selenium and sulfur.

7. The memory cell of claim 1 wherein more than 50 atomic percent of the buffer region corresponds to one or more tellurides selected from the group consisting of aluminum telluride, hafnium telluride and zirconium telluride.

8. The memory cell of claim 1 wherein the buffer region comprises a gradient of Group 14 element concentration, with the concentration being highest along an interface with the ion reservoir material.

9. A memory cell, comprising:
   an electrode;
   an ion-conductive switching material over the electrode;
   a buffer region over the ion-conductive switching material;
   an ion reservoir material over the switching material; and
   the buffer region comprising a gradient of Group 14 element concentration, with the concentration being highest along an interface with the ion reservoir material.

10. The memory cell of claim 9 wherein the switching material comprises aluminum oxide.

11. The memory cell of claim 9 wherein the ion reservoir material comprises one or more tellurides in combination with one or more of aluminum, copper and silver.

12. The memory cell of claim 9 wherein the buffer region comprises one or more tellurides selected from the group consisting of aluminum telluride, hafnium telluride and zirconium telluride.

13. The memory cell of claim 12 wherein the one or more tellurides consist of aluminum telluride.

14. The memory cell of claim 12 wherein the one or more tellurides consist of hafnium telluride.

15. The memory cell of claim 12 wherein the one or more tellurides consist of zirconium telluride.

16. The memory cell of claim 9 wherein the elements from Group 14 of the periodic table within the buffer region include carbon.

17. The memory cell of claim 9 wherein the elements from Group 14 of the periodic table within the buffer region include silicon.

18. The memory cell of claim 9 wherein the elements from Group 14 of the periodic table within the buffer region include germanium.

19. The memory cell of claim 9 wherein the elements from Group 14 of the periodic table within the buffer region include tin.

20. A method of forming a memory cell, comprising:
    forming an ion-conductive switching material over a first electrode;
    forming a buffer region over the ion-conductive switching material; wherein the buffer region comprises a laminate containing layers that comprise one or more elements from Group 14 of the periodic table alternating with layers that do not comprise Group 14 elements; and
    forming an ion reservoir material over the buffer region.

21. The method of claim 20 wherein buffer region further comprises one or more chalcogen elements selected from the group consisting of tellurium, selenium and sulfur.

* * * * *